US010735011B2

(12) United States Patent
Kwon et al.

(10) Patent No.: US 10,735,011 B2
(45) Date of Patent: Aug. 4, 2020

(54) DIGITAL-TO-ANALOG CONVERTER AND DRIVING CIRCUIT OF DISPLAY DEVICE HAVING THE SAME

(71) Applicants: SAMSUNG DISPLAY CO., LTD., Yongin-si, Gyeonggi-Do (KR); KOREA ADVANCED INSTITUTE OF SCIENCE AND TECHNOLOGY, Daejeon (KR)

(72) Inventors: Ohjo Kwon, Suwon-si (KR); Gyu-Hyeong Cho, Daejeon (KR); Ki-Duk Kim, Daejeon (KR); Ji-Su Choi, Daejeon (KR)

(73) Assignees: SAMSUNG DISPLAY CO., LTD., Yongin-si, Gyeonggi-Do (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/002,209

(22) Filed: Jun. 7, 2018

(65) Prior Publication Data

US 2018/0358975 A1    Dec. 13, 2018

(30) Foreign Application Priority Data

Jun. 7, 2017 (KR) .................. 10-2017-0070831

(51) Int. Cl.
*G06F 3/038* (2013.01)
*G09G 5/00* (2006.01)
(Continued)

(52) U.S. Cl.
CPC .............. *H03M 1/066* (2013.01); *G09G 3/20* (2013.01); *G09G 3/3291* (2013.01);
(Continued)

(58) Field of Classification Search
None
See application file for complete search history.

(56) References Cited

U.S. PATENT DOCUMENTS

2006/0158420 A1\*   7/2006   Chang .................. G09G 3/3688
345/100

FOREIGN PATENT DOCUMENTS

KR      10-2016-0040809         4/2016

OTHER PUBLICATIONS

Kim et al., A 10-Bit Column-Driver IC With Parasitic-Insensitive Iterative Charge-Sharing Based Capacitor-String Interpolation for Mobile Active-Matrix LCDs, Mar. 2014, IEEE Journal of Solid-State Circuits, vol. 49, No. 3, p. 766-775 (Year: 2014).\*
(Continued)

*Primary Examiner* — Lunyi Lao
*Assistant Examiner* — Kirk W Hermann
(74) *Attorney, Agent, or Firm* — F. Chau & Associates, LLC.

(57) ABSTRACT

A digital-to-analog converter having a structure that converter may decrease an effect of a mismatch between elements and decrease a quantity of the elements. The digital-to-analog converter includes a multiplexer configured to output a first voltage or a second voltage corresponding to an input bit as an input voltage and a recursive switched circuit configured to alternately receive the input voltage and a reference voltage and to output an average value of the input voltage and the reference voltage as an output voltage.

20 Claims, 10 Drawing Sheets

(51) Int. Cl.
*H03M 1/06* (2006.01)
*G09G 3/3291* (2016.01)
*G09G 3/20* (2006.01)
*H03M 1/66* (2006.01)

(52) U.S. Cl.
CPC ............. *G09G 2310/027* (2013.01); *G09G 2310/0291* (2013.01); *G09G 2310/0294* (2013.01); *G09G 2310/0297* (2013.01); *H03M 1/66* (2013.01)

(56) References Cited

OTHER PUBLICATIONS

Stites, The SM-2010 Project: The System Clock, http://www.birthofasynth.conn/Scott_Stites/Pages/sm_2010_3phase.html, 2010, p. 1-2 (Year: 2010).*

Kim et al., "A 10-Bit Column-Driver IC With Parasitic-Insensitive Iterative Charge-Sharing Based Capacitor-String Interpolation for Mobile Active-Matrix LCDs", IEEE J. Solid-State Circuits, vol. 49, No. 3, pp. 766-782, Mar. 2014.

* cited by examiner

DIGITAL-TO-ANALOG CONVERTER AND DRIVING CIRCUIT OF DISPLAY DEVICE HAVING THE SAME

CROSS-REFERENCE TO RELATED APPLICATION(S)

This application claims priority under 35 USC § 119 from Korean Patent Application No. 10-2017-0070831, filed on Jun. 7, 2017 in the Korean Intellectual Property Office (KIPO), the contents of which are incorporated by reference herein.

1. Technical Field

The inventive concept generally relates to a digital-analog converter. More particularly, embodiments of the present inventive concept relate to a digital-analog converter and a driving circuit of a display device having the same.

2. Discussion of the Related Art

Flat panel display (FPD) devices are widely used as a display device of electronic devices because FPD devices are relatively lightweight and thin as compared to cathode-ray tube (CRT) display devices. Examples of FPD devices are liquid crystal display (LCD) devices, field emission display (FED) devices, plasma display panel (PDP) devices, and organic light emitting display (OLED) devices. The OLED devices have drawn attention as being next-generation display devices because the OLED devices have various advantages over several other types of display, such as a wide viewing angle, a rapid response speed, a thin thickness, low power consumption, etc.

In general, a conventional display device may convert a digital image signal provided from an external device into an analog signal using a digital-to-analog converter (DAC) and provides the analog signal to a display panel. As a resolution of the display device increases, the number of bit of the digital image signal increases. Thus, a capacitance of element of the digital-to-analog converter and the number of elements of the digital-to-analog converter increases.

SUMMARY

Some embodiments of the inventive concept provide a digital-to-analog converter capable of decreasing an effect of a mismatch between elements and decreasing a number of the elements.

Some embodiments of the inventive concept provide a driving circuit of display device having the digital analog converter capable of decreasing an effect of a mismatch between elements and decreasing a number of the elements.

According to an embodiment of the inventive concept, a digital-to-analog converter may include a multiplexer configured to output a first voltage or a second voltage corresponding to an input bit as an input voltage and a recursive switched circuit configured to alternately receive the input voltage and a reference voltage and to output an average value of the input voltage and the reference voltage as an output voltage.

In an embodiment of the inventive concept, the recursive switched circuit may include a first capacitor and a second capacitor configured to divide the input voltage and the reference voltage, a first switch block configured to couple the multiplexer that provides the input voltage to the first capacitor and the second capacitor, and a second switch block configured to couple a reference voltage provider that provides the reference voltage to the first capacitor and the second capacitor.

The input voltage and the reference voltage may be received through different paths.

The recursive switched circuit includes: a first capacitor and a second capacitor configured to divide the alternately received input voltage and the reference voltage across the first capacitor and the second capacitor; a first switch block configured to couple the multiplexer that provides the input voltage to the first capacitor and the second capacitor; and a second switch block configured to couple a reference voltage provider that provides the reference voltage to the first capacitor and the second capacitor.

The first switch block may provide a first path to charge both the first capacitor and the second capacitor, and the second switch block may provide a second path to charge both the first capacitor and the second capacitor.

In an embodiment of the inventive concept, the first switch block and the second switch block may turn on or turn off according to a phase of a control signal.

In an embodiment of the inventive concept, the control signal may be a square wave with a regular cycle, which may be a duty cycle.

In an embodiment of the inventive concept, the digital-to-analog converter may further include a controller configured to generate the control signal.

In an embodiment of the inventive concept, the first switch block may turn on when the first control signal having a first phase is provided and the second switch block may turn on when the second control signal having a second phase is provided.

In an embodiment of the inventive concept, the first capacitor and the second capacitor may be coupled in series in the first phase and the second phase.

In an embodiment of the inventive concept, the recursive switched circuit corresponding to a most significant bit may receive the predetermined reference voltage.

In an embodiment of the inventive concept, the recursive switched circuit corresponding to the input bit that is not (e.g., other than) a most significant bit may receive the output voltage of the recursive switched circuit corresponding to an upper bit as the reference voltage.

According to an embodiment of the inventive concept, a driving circuit of a display device may include a digital-to-analog converter configured to convert a digital image signal into an analog image signal and an output buffer configured to output the analog image signal to a plurality of data line. The digital-to-analog converter may include a multiplexer configured to output a first voltage and a second voltage corresponding to an input bit of the digital image signal as an input voltage and a recursive switched circuit configured to alternately receive the input voltage and a reference voltage and to output an average value of the input voltage and the reference voltage as an output voltage.

In an embodiment of the inventive concept, the recursive switched circuit may include a first capacitor and a second capacitor configured to divide the input voltage and the reference voltage, a first switch block configured to couple the multiplexer that provides the input voltage to the first capacitor and the second capacitor, and a second switch block configured to couple a reference voltage provider that provides the reference voltage to the first capacitor and the second capacitor.

In an embodiment of the inventive concept, the first switch block and the second switch block may turn on or turn off according to a phase of a control signal.

In an embodiment of the inventive concept, the control signal may be a square wave with a regular duty cycle.

In an embodiment of the inventive concept, the driving circuit of the display device may further include a controller configured to generate the control signal.

In an embodiment of the inventive concept, the first switch block may turn on when the control signal having a first phase is provided, and the second switch block may turn on when the control signal having a second phase is provided.

In an embodiment of the inventive concept, the first capacitor and the second capacitor may be coupled in series in the first phase and the second phase.

In an embodiment of the inventive concept, the recursive switched circuit corresponding to a most significant bit may receive the predetermined reference voltage.

In an embodiment of the inventive concept, the recursive switched circuit corresponding to the input bit other than a most significant bit may receive the output voltage of the recursive switched circuit corresponding to an upper bit as the reference voltage.

In an embodiment of the inventive concept, a method of digital-to-analog conversion, includes outputting by a multiplexer a first voltage or a second voltage respectively corresponding to a value of an input bit of a digital image signal; and outputting, by a recursive switched circuit configured to alternately receive an input voltage and a reference voltage, an output voltage comprising an average value of the input voltage and the reference voltage.

The recursive switched circuit includes a first capacitor and a second capacitor configured to divide the alternately received input voltage and the reference voltage across the first capacitor and the second capacitor; and the method further includes that in response to receiving a control signal having a first phase, turning on a first switch block and providing the input voltage to the first capacitor and the second capacitor; and in response to the control signal having a second phase different from the first phase, turning on a second switch block and providing the reference voltage to the first capacitor and the second capacitor, and wherein the first switch block switch provides a first path to charge both the first capacitor and the second capacitor, and the second switch block provides a second path to charge both the first capacitor and the second capacitor.

Therefore, a digital-to-analog converter and a driving circuit of a display device having the same may generate an analog signal that decreases an effect of mismatch between capacitors included in the digital-to-analog converter by including a multiplexer that output an input voltage according to an input bit and a recursive switched circuit that outputs an average value of the input voltage and a reference voltage. Further, the digital-to-analog converter and the driving circuit of the display device having the same may prevent a number of elements to be increased as a size of the input bit increases.

BRIEF DESCRIPTION OF THE DRAWINGS

Illustrative, non-limiting example embodiments of the inventive concept will be better-appreciated by a person of ordinary skill in the art from the following detailed description taken in conjunction with the accompanying drawings.

DETAILED DESCRIPTION

Hereinafter, the present inventive concept will be explained in detail with reference to the accompanying drawings.

Figure 1:
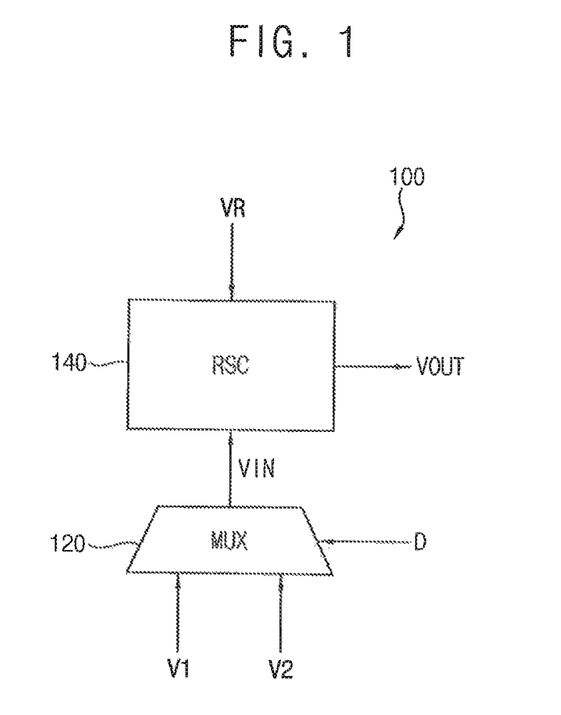
FIG. 1 is a diagram illustrating a digital-to-analog converter according to an embodiment of the inventive concept.
Figure 2:
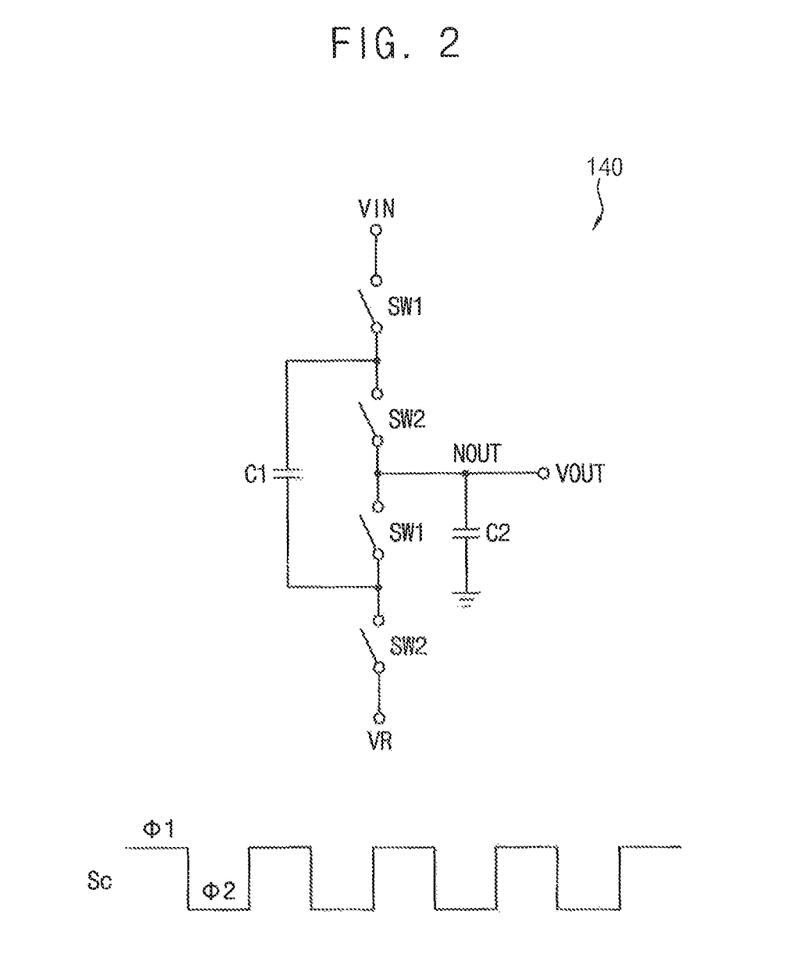
FIG. 2 is a circuit diagram illustrating a recursive switched circuit included in the digital-to-analog converter included in the display device of FIG. 1.

FIG. 1 is a diagram illustrating a digital-to-analog converter according to an embodiment of the inventive concept, and FIG. 2 is a circuit diagram illustrating a recursive switched circuit included in the digital-to-analog converter included in the display device of FIG. 1.

Referring now to FIG. 1, a digital-to-analog converter (DAC) 100 may include a multiplexer 120 and a recursive switched circuit 140.

The multiplexer 120 may output a first voltage V1 or a second voltage V2 as an input voltage VIN in correspondence with an input bit D. For example, the multiplexer 120 may output the first voltage V1 as the input voltage VIN when the input bit D is 0, and may output the second voltage V2 as the input voltage VIN when the input bit D is 1. In addition, a voltage level of the first voltage V1 and a voltage level of the second voltage V2 may be different from each other. For example, the voltage level of the first voltage V1 may be lower than the voltage level of the second voltage V2. The multiplexer 120 may provide the input voltage VIN to the recursive switched circuit 140 coupled to the multiplexer 120.

The recursive switched circuit 140 may alternately receive the input voltage VIN and a reference voltage VR and may output an average value of the input voltage VIN and the reference voltage VR as an output voltage VOUT. The reference voltage VR may be received via a separate input.

Referring now to FIG. 2, the recursive switched circuit 140 may include, for example, a first capacitor C1, a second capacitor C2, a first switch block SW1, and a second switch block SW2. The input voltage VIN and the reference voltage VR may be divided by (e.g. voltage dropped across) the first capacitor C1 and the second capacitor C2. The first switch block SW1 may couple the multiplexer 120 that provides the input voltage VIN in series to the recursive switched circuit 140 including the first capacitor C1 and the second capacitor C2. Here, the input voltage VIN may be provided to a first terminal of the first capacitor C1. A second terminal of the first capacitor C1 may be coupled to the second capacitor C2. The first capacitor C1 and the second capacitor C2 may share charge of the input voltage Vin provided through the first terminal of the first capacitor C1. The second switch block SW2 may couple a reference voltage provider that provides the reference voltage VR in series to the recursive switched circuit 140 including the first capacitor C1 and the second capacitor C2. Here, the reference voltage VR may be provided to the second terminal of the first capacitor C1. The first terminal of the first capacitor C1 may be coupled to the second capacitor C2. The first capacitor C1 and the second capacitor C2 may share the charge of the reference voltage VR provided through the second terminal of the first capacitor C1. A voltage of an output node NOUT coupled to the first capacitor C1 and the second capacitor C2 may output as the output voltage VOUT.

The first switch block SW1 and the second switch block SW2 may be turned on or turned off according to a phase Φ1, Φ2 of a control signal Sc. Here, the control signal Sc may be a square wave having a regular cycle (e.g., a constant duty cycle or a constant frequency). The digital-to-analog converter 100 may further include a controller that generates the control signal Sc. The input voltage VIN may be provided to the first capacitor C1 and the second capacitor C2 when the first switch block SW1 turns on. The reference voltage VR may be provided to the first capacitor C1 and the second capacitor C2 when the second switch block SW2 turns off. The input voltage VIN and the reference voltage VR may be alternately provided to the first capacitor C1 and the second capacitor C2 because the first switch block SW1 and the second switch block SW2 alternately turns on according to the control signal Sc. The arrangement of the first capacitor C1 and the second capacitor C2 may divide the input voltage VIN and the reference voltage VR and the recursive switched circuit 140 may output an average value as the output voltage VOUT. An operation method of the recursive switched circuit 140 will now be described in detail referring to FIGS. 3A and 3B.

Figure 4:
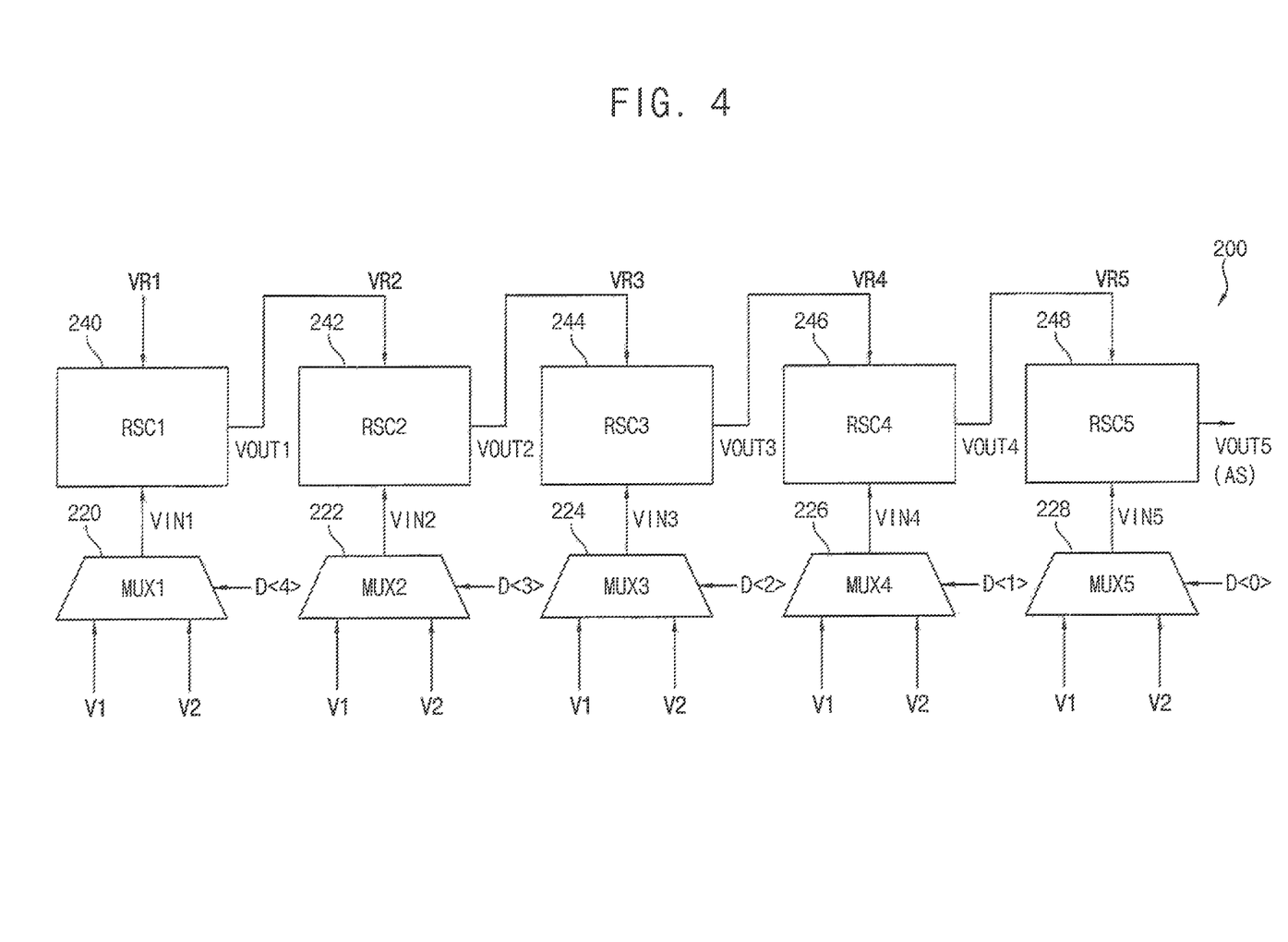
FIG. 4 is a diagram illustrating an example of the digital-to-analog converter of FIG. 1.

According to the inventive concept, the digital-to-analog converter 100 may include a plurality of multiplexers 120 and a plurality of recursive switched circuits 140 according to a number of bits of the input data. For example, the digital-to-analog converter 100 may include an "n" multiplexer 120 and an "n" recursive switched circuit 140 when the n-bit input data inputs. The multiplexer 120 and the recursive switched circuit 140 corresponding to each of the bit may be electrically coupled. Further, when there is a plurality of recursive switched circuits 140, each one recursive switched circuit 140 may be coupled to the recursive switched circuit 140 corresponding to a lower bit. The recursive switched circuit 140 that corresponds to a most significant bit (MSB) of the input data bits may receive the predetermined reference voltage VR. The recursive switched circuit 140 corresponding to an input bit "D" (the D bit is not the most significant bit) may receive the output voltage VOUT that is output from the recursive switched circuit 140 corresponding to an upper bit as the reference voltage VR. In other words, there may be a string of recursive switched circuits 140 (an example of which is shown in FIG. 4). The output voltage VOUT output from the recursive switched circuit 140 corresponding to a least significant bit (LSB) may output as an analog signal into which the input data is converted.

As described above, the digital-to-analog converter 100 such as shown in FIG. 1 may include the multiplexer 120 and the recursive switched circuit 140. The multiplexer 120 may output to the recursive switched circuit the input voltage VIN corresponding to the input bit D. The recursive switched circuit 140 may divide the input voltage VIN and the reference voltage VR and generate the output voltage VOUT. Here, the structure of the recursive switched circuit 140 may decrease an effect of a mismatch between the first capacitor C1 and the second capacitor C2 by alternately and repeatedly receiving the input voltage VIN and the reference voltage VR and dividing the input voltage VIN and the reference voltage VR through the use of a series connection of the first capacitor C1 and the second capacitor C2. Further, one multiplexer 120 and one recursive switched circuit 140 may be added when one input bit D increases. Thus, the digital-to-analog converter 100 of FIG. 1 may prevent the number of elements included in the digital-to-analog converter 100 from rapidly increasing.

Figure 3A:
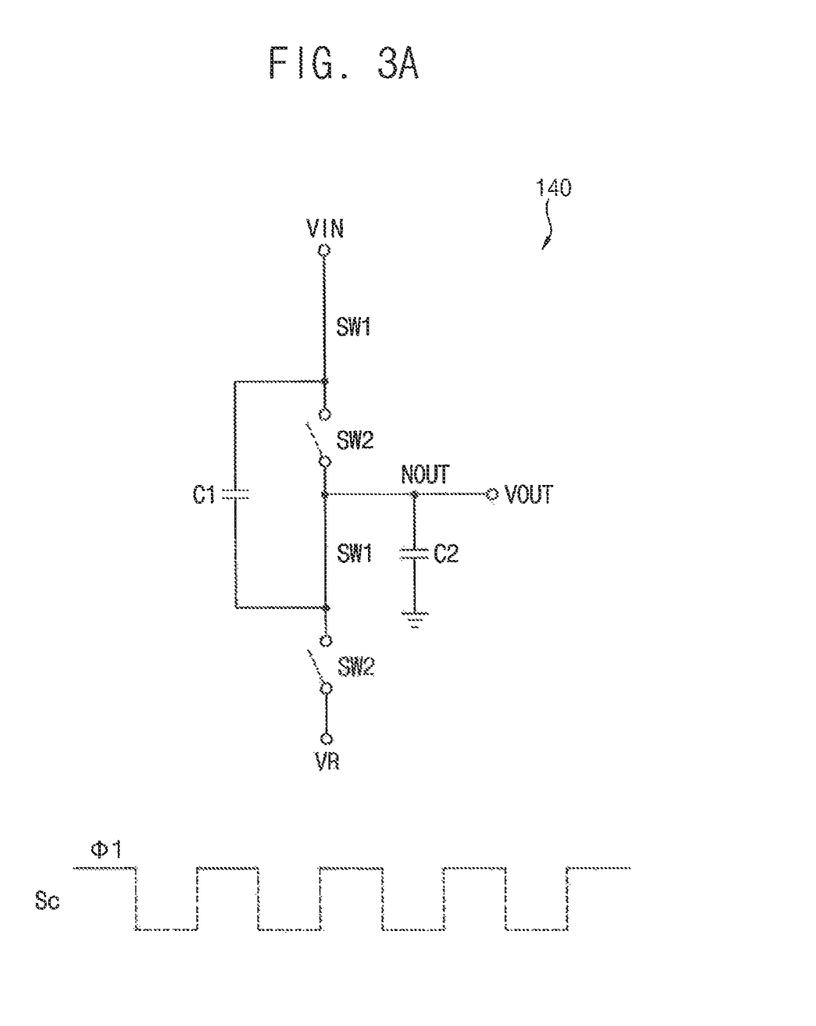
FIGS. 3A and 3B are circuit diagrams illustrating an operation of the recursive switched circuit of FIG. 2.
Figure 3B:
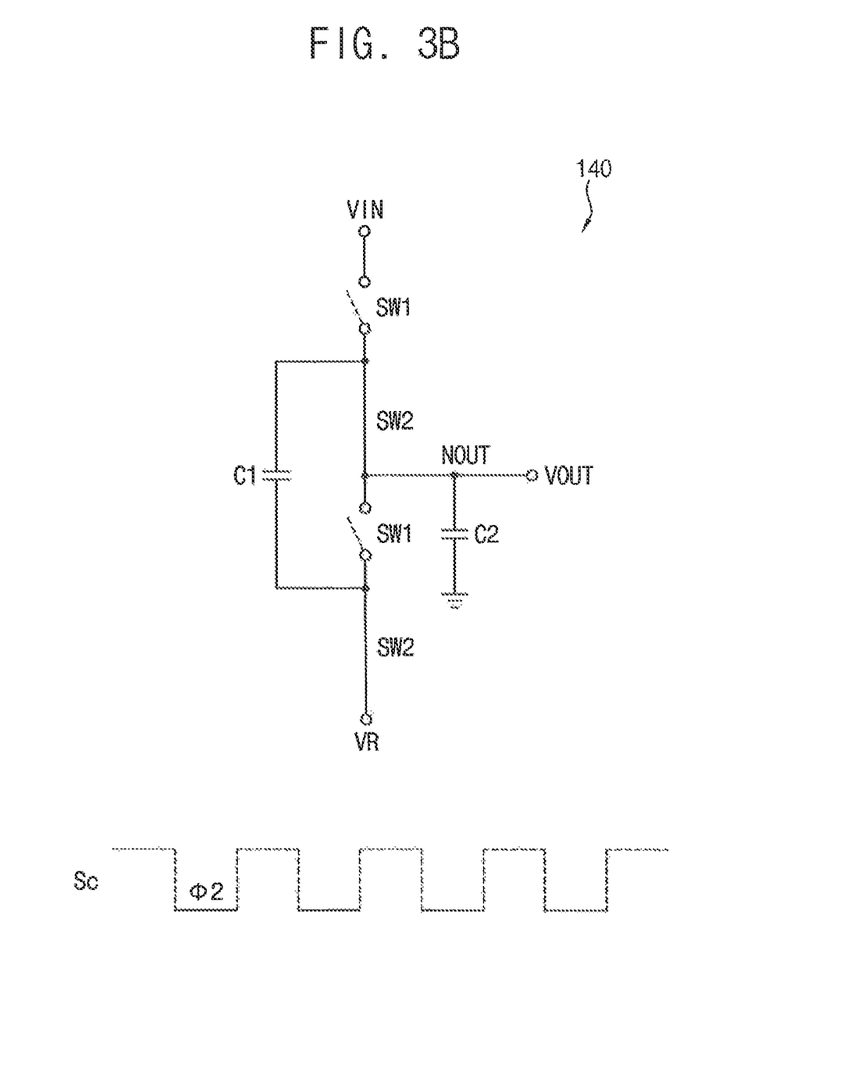

FIGS. 3A and 3B are circuit diagrams illustrating an operation of the recursive switched circuit of FIG. 2.

Referring to FIGS. 3A and 3B, the recursive switched circuit 140 may include the first switch block SW1, the second switch block SW2, the first capacitor C1, and the second capacitor C2. The first switch block SW and the second switch block SW2 may turn on or turn off according to the value of the control signal Sc. The first switch block SW1 and the second switch block SW2 may couple the first capacitor C1 and the second capacitor C2. Here, the control signal Sc may be the square wave having a regular (e.g., constant) cycle. For example, the control signal Sc may be the square wave having the first phase Φ1 and the second phase Φ2.

The first switch block SW1 may turn on when the control signal Sc having the first phase Φ1 is provided as described in FIG. 3A. The first terminal of the first capacitor C1 may be coupled to the multiplexer 120 and may receive the input voltage VIN when the first switch block SW1 turns on. The second terminal of the first capacitor C1 may be coupled to the first terminal of the second capacitor C2. The second terminal of the second capacitor C2 may have a ground level (0). Here, the first capacitor C1 and the second capacitor C2 may be coupled in series. The first capacitor C1 and the second capacitor C2 may share the charge of the input voltage VIN, with voltage drops totaling VIN being distributed across the capacitors. A voltage of the output node NOUT at which the second terminal of the first capacitor C1 and the first terminal of the second capacitor C2 are coupled may be output as the output voltage VOUT of the recursive switched circuit 140.

The second switch block SW2 may turn on when the control signal Sc having the second phase Φ2 is provided as described in FIG. 2 and FIG. 3B. The second terminal of the first capacitor C1 may be coupled to the reference voltage provider and may receive the reference voltage VR when the second switch block SW2 turns on. The first terminal of the first capacitor C1 may be coupled to the first terminal of the second capacitor C2. The second terminal of the second capacitor C2 may have the ground level (0). Here, the first capacitor C1 and the second capacitor C2 may be coupled in series. The first capacitor C1 and the second capacitor C2 may share the charge of the reference voltage VR. A voltage of the output node NOUT at which the second terminal of the first capacitor C1 and the first terminal of the second capacitor C2 are coupled may be output, as shown in FIG. 3B, as the output voltage VOUT of the recursive switched circuit 140.

A capacitance of the first capacitor C1 and a capacitance of the second capacitor C2 included in the recursive switched circuit 140 of FIGS. 3A and 3B may be the same. Alternatively, the capacitance of the first capacitor C1 and the capacitance of the second capacitor C2 included in the recursive switched circuit 140 of FIGS. 3A and 3B may be different from each other. The capacitance of the second capacitor C2 may be represented as in Equation 1 herein below on the basis of the capacitance of the first capacitor C1:

$$C2 = C + \Delta C \quad \text{[Equation 1]}$$

In the Equation 1 above, the C is the capacitance of the first capacitor C1, and the $\Delta C$ is the difference between the capacitance of the first capacitor C1 and the capacitance of the second capacitor C2.

The first switch block SW1 and the second switch block SW2 are alternately and repeatedly switched. The output voltage VOUT may be represented as in Equation 2 herein below at (K+1)th switching:

$$VOUT[K+1] = \frac{\Delta C}{C + (C + \Delta C)} VOUT[K] + \frac{C \times (VIN + VR)}{C + (C + \Delta C)} \quad \text{[Equation 2]}$$

Here, the VOUT[K+1] is the output voltage VOUT at (K+1)th switching, the C is the capacitance of the first capacitor C1, the $\Delta C$ is the difference between the capacitance of the first capacitor C1 and the capacitance of the second capacitor C2, the VOUT[K] is the output voltage VOUT at (K)th switching, the VIN is the input voltage, and the VR is the reference voltage.

The output voltage VOUT of recursive switched circuit 140 may be represented as in Equation 3 hereinbelow when the number of switching is larger than a predetermined number:

$$V[\infty] = \frac{C \times (VIN + VR)}{C + C} = \frac{VIN + VR}{2} \quad \text{[Equation 3]}$$

As described in the equation 3 herein above, the recursive switched circuit 140 may output the average value of the input voltage VIN and the reference voltage VR as the output voltage VOUT regardless of the difference between the capacitance of the first capacitor C1 and the capacitance of the second capacitor C2. Thus, the recursive switched circuit 140 may output the output voltage VOUT that is insensitive (e.g., unaffected) by the mismatch that occurs because of the difference between the capacitance of the first capacitor C1 and the capacitance of the second capacitor C2.

Figure 5:
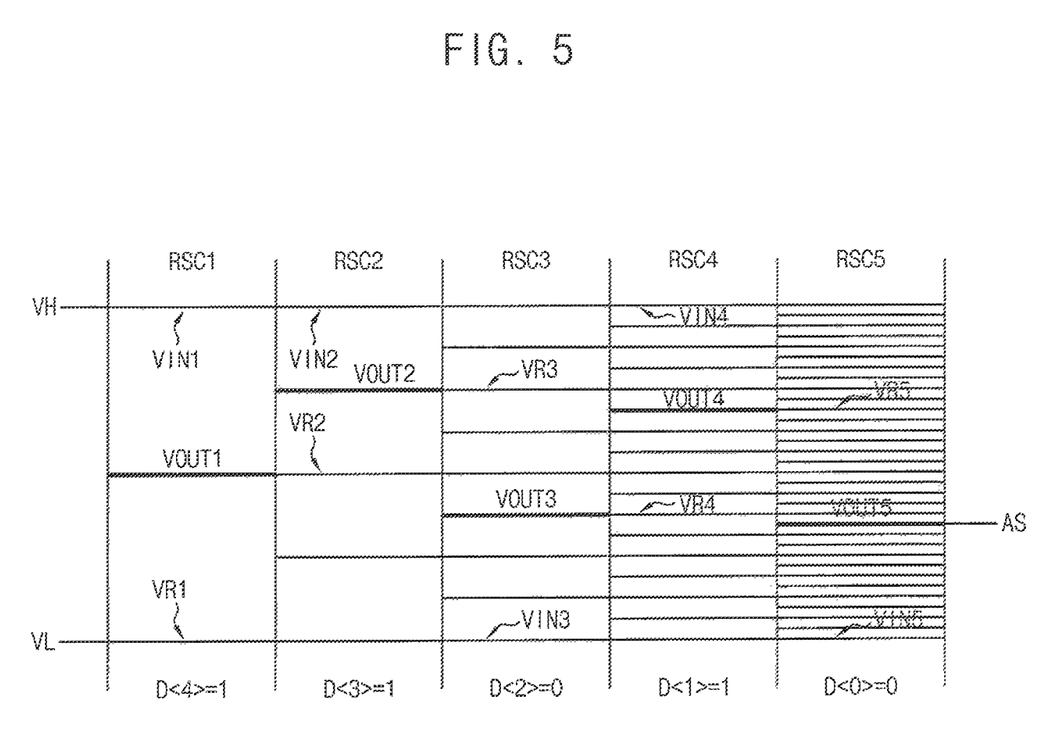
FIG. 5 is a diagram illustrating an operation of the digital-to-analog converter of FIG. 4.

FIG. 4 is a diagram illustrating an example of the digital-to-analog converter of FIG. 1 and FIG. 5 is a diagram illustrating an operation of the digital-to-analog converter of FIG. 4.

FIG. 4 represents a digital-to-analog converter 200 that converts a 5-bit input data into an analog signal. There may be, in this arrangement, five of the circuits shown in FIG. 1, but the inventive concept is not limited thereto. An operation of the digital-to-analog converter 200 will be described referring to FIGS. 4 and 5 when the 5-bit input data, 11010, is input to the digital-to-analog converter 200.

Referring to FIG. 4, the digital-to-analog converter 200 may include first through fifth multiplexers 220, 222, 224, 226, 228 that respectively receive input bits D<4>, D<3>, D<2>, D<1>, D<0> and first through fifth recursive switched circuits 240, 242, 244, 246, 248. The first through fifth multiplexers 220, 222, 224, 226, 228 may respectively output a first voltage V1 or a second voltage V2 as input voltages VIN1, VIN2, VIN3, VIN4, VIN5 according to the input bits D<4>, D<3>, D<2>, D<1>, D<0>. For example, the respective multiplexer may output the first voltage V1 as the input voltage when the input bit is 0 and may output the second voltage V2 as the input voltage when the input bit is 1. Here, the first voltage V1 may be a low level VL and the second voltage V2 may be a high level VH.

The first multiplexer 220 may output the second voltage V2 corresponding to a most significant bit D<4>, that is 1, as the first input voltage VIN1 (in this particular example, with the 5-bit input data is 11010 as discussed herein above). The first recursive switched circuit 240 coupled to the first multiplexer 220 may alternately and repeatedly receive a predetermined first reference voltage VR1 and the first input voltage VIN1 provided from the first multiplexer 220. The first recursive switched circuit 240 may output an average value of the first reference voltage VR1 and the first input voltage VIN1 as a first output voltage VOUT1. For example, the first reference VR1 may have the low level VL. The first recursive switched circuit 240 may output the average value of the first input voltage VIN1 having the high level VH and the first reference voltage VR having the low level VL as the first output voltage VOUT1.

With continued reference to FIG. 4, it can be seen that the first recursive switched circuit 240 may be coupled to the second recursive switched circuit 242. For example, the first output voltage VOUT1 output from the first recursive switched circuit 240 may be provided to the second recursive switched circuit 242 as a second reference voltage VR2.

The second multiplexer 222 may output the second voltage V2 corresponding to a next input bit D<3>, that is 1 (in this example the 5-bit input is 11010), as the second input voltage VIN2. The second recursive switched circuit 242 coupled to the second multiplexer 222 may alternately and repeatedly receive the second reference voltage VR2 provided from the first recursive switched circuit 240 and the second input voltage VIN2 provided from the second multiplexer 222. The second recursive switched circuit 242 may output an average value of the second reference voltage VR2 and the second input voltage VIN2 having the high level VH as a second output voltage VOUT2. The second recursive switched circuit 242 may be coupled to the third recursive switched circuit 244. The second output voltage VOUT2 output from the second recursive switched circuit 242 may be provided to the third recursive switched circuit 244 as a third reference voltage VR3.

The third multiplexer 224 may output the first voltage V1 corresponding to a next input bit D<2>, that is 0 (in this example the 5-bit input is 11010), as the third input voltage VIN3. The third recursive switched circuit 244, which is shown in FIG. 4 as being coupled to the third multiplexer 224, may alternately and repeatedly receive the third reference voltage VR3 provided from the second recursive switched circuit 242 and the third input voltage VIN3 provided from the third multiplexer 224. The third recursive switched circuit 244 may output an average value of the third reference voltage VR3 and the third input voltage VIN3 having the low level VL as a third output voltage VOUT3. The third recursive switched circuit 244 may be coupled to the fourth recursive switched circuit 246 as shown in FIG. 4. The third output voltage VOUT3 output from the third recursive switched circuit 244 may be provided to the fourth recursive switched circuit 246 as a fourth reference voltage VR4.

The fourth multiplexer 226 may output the second voltage V2 corresponding to a next input bit D<1> that is 1 (in this example the 5-bit input is 11010), as the fourth input voltage VIN4. The fourth recursive switched circuit 246 coupled to the fourth multiplexer 226 may alternately and repeatedly receive the fourth reference voltage VR4 provided from the third recursive switched circuit 244 and the fourth input voltage VIN4 provided front the fourth multiplexer 226. The fourth recursive switched circuit 246 may output an average value of the fourth reference voltage VR4 and the fourth input voltage VIN4 having the high level VH as a fourth output voltage VOUT4. As shown in FIG. 4, the fourth recursive switched circuit 246 may be coupled to the fifth recursive switched circuit 248. The fourth output voltage VOUT4 output from the fourth recursive switched circuit 246 may be provided to the fifth recursive switched circuit 248 as a fifth reference voltage VR5.

The fifth multiplexer 228 may output the first voltage V1 corresponding to a next input bit D<0>, that is 0 (in this example the 5-bit input is 11010), as the fifth input voltage VIN5. The fifth recursive switched circuit 248 coupled to the fifth multiplexer 228 may alternately and repeatedly receive the fifth reference voltage VR5 provided from the fourth recursive switched circuit 246 and the fifth input voltage VIN5 provided from the fifth multiplexer 228. The fifth recursive switched circuit 248 may output an average value of the fifth reference voltage VR5 and the fifth input voltage VIN5 having the low level VL as a fifth output voltage VOUT5. The fifth output voltage VOUT5 of the fifth recursive switched circuit 248 may be output as an analog signal AS of the digital-to-analog converter 200. Here, the analog signal AS is the converted signal of the 5-bit input data (that is, the digital signal 11010 is converted to analog by the d/a converter 200 and output as the signal AS).

FIG. 5 shows the operation of the digital-to-analog converter such as shown in FIG. 4. FIG. 5 shows the recursive switches RSC1 through RSC5. FIG. 5 also shows that the voltage output VOUT1 of RC1 is input to VR2 of the next recursive switches, and the voltage output VOUT2 of RSC2 is input to VR3, and the voltage VOUT 3 of RSC3 is input to VR4, and the voltage output VOUT4 is input to VR5, and VOUT 5 is the analog signal (AS) of the converted digital input signal 11011.

Figure 6:
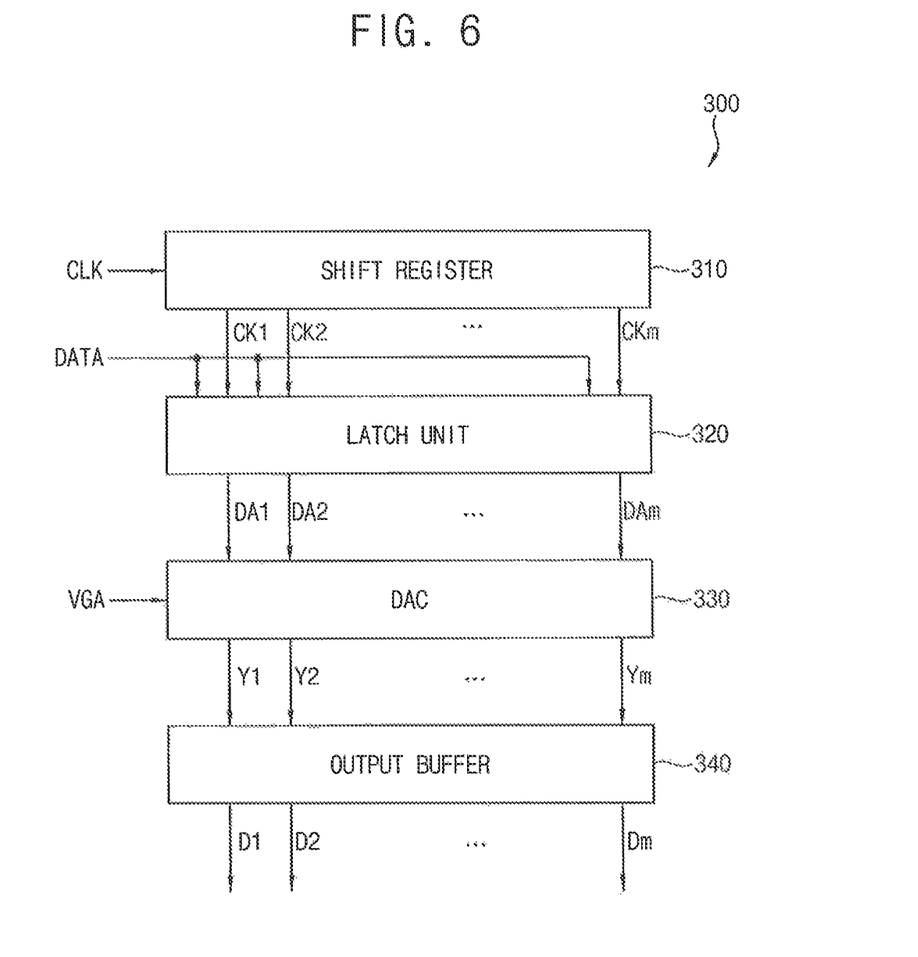
FIG. 6 is a block diagram illustrating a driving circuit of a display device according to an embodiment of the inventive concept.

FIG. 6 is a block diagram illustrating a driving circuit of a display device according to an embodiment of the inventive concept.

Referring to FIG. 6, a driving circuit 300 of a display device may include a shift register 310, a latch 320, a digital-to-analog converter 330, and an output buffer 340. Here, the digital-to-analog converter 330 may correspond to the digital-to-analog converter 330 of FIG. 1.

The shift register 310 may sequentially activate latch clock signals CK1, CK2, . . . , CKm in synchronization with clock signal CLK. The latch 320 may latch the image signal DATA in synchronization with the latch clock signals CK1, CK2, . . . , CKm and simultaneously applies latch digital image signals DA1, DA2, . . . , DAm to the digital-to-analog converter 330 in response to a line latch signal from a timing controller.

The digital-to-analog converter 330 may convert the digital image signals DA1, DA2, . . . , DAm into analog image signals Y1, Y2, . . . , Ym. The digital-to-analog converter 330 may receive gamma voltage VGA provided from a gamma voltage generator, convert the digital image signals DA1, DA2, . . . , DAm into the analog image signals Y1, Y2, . . . , Ym, and output the analog image signals Y1, Y2, . . . , Ym to the output buffer 340.

The digital-to-analog converter 330 may include multiplexers and a recursive switched circuit. The multiplexer may output a first voltage or second voltage corresponding to input bit of the digital image signal DA1, DA2, . . . , DAm as an input voltage. The recursive switched circuit may alternately and repeatedly receive the input voltage and a reference voltage and may output an average value of the input voltage and the reference voltage as an output voltage. The recursive switched circuit may decrease an effect of a mismatch between capacitors that divide the input voltage and the references voltage using a series connection of the capacitors. The digital-to-analog converter 330 may include at least one multiplexer 120 and at least one recursive switched circuit 140 according to the number of bit of the digital image signal DA1, DA2, . . . , DAm.

The output buffer 340 may output the plurality of analog image signals Y1, Y2, . . . , Ym to a plurality of data lines D1, D2, . . . , Dm As described above, the driving circuit 300 of display device of FIG. 6 may include the digital-to-analog converter 330 that is constructed if at least the multiplexer and the recursive switched circuit. The multiplexer may output an input voltage corresponding to the input bit. The recursive switched circuit may generate output voltage by dividing the input voltage and the reference voltage. Here, the recursive switched circuit may decrease the effect of a mismatch between the capacitors by alternately and repeatedly receiving the input voltage and the reference voltage and dividing the input voltage and reference voltage using the series connection of the capacitors.

Figure 7:
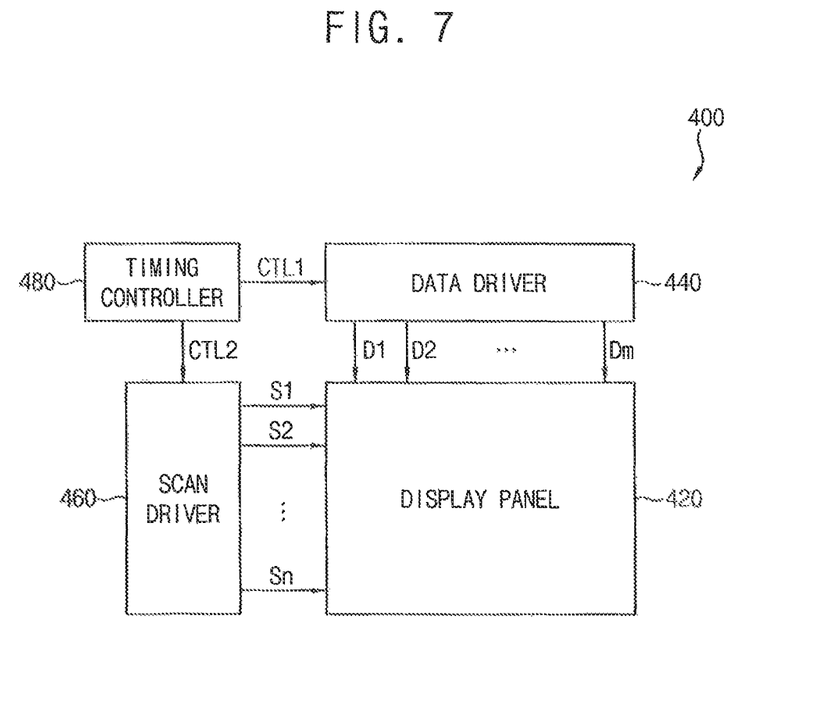
FIG. 7 is a block diagram illustrating the display device that includes the driving circuit of FIG. 6.

FIG. 7 is a block diagram illustrating the display device that includes the driving circuit of FIG. 6.

Referring to FIG. 7, the display device 400 may include a display panel 420, a data driver 440, a scan driver 460, and a timing controller 480. The data driver 440 of FIG. 7 may correspond to the driving circuit 300 of the display device of FIG. 6.

The display panel 420 may include a plurality of pixels. A plurality of data lines D1, D2, . . . , Dm and a plurality of scan lines S1, S2, . . . , Sn may be formed in the display panel 420. A plurality of pixels may be formed in intersection regions of the data lines D1, D2, . . . , Dm and the scan lines S1, S2, . . . , Sn.

The data driver 440 may provide a data signal (that is, an analog image signal) to the pixels through the data lines D1, D2, . . . , Dm according to the scan signal. Specifically, the data driver 330 may include a shift register, a latch, a digital-to-analog converter, and an output buffer. The shift register may activate latch clock signals in synchronization with a clock signal provided from the timing controller 480. The latch may latch the digital image signal in synchronization with the latch clock signal. The digital-to-analog converter may convert the digital image signal into the analog image signal. Here, the digital-to-analog converter may output the analog image signal of which an effect of a mismatch of capacitors is minimized using a multiplexer and a recursive switched circuit. The output buffer may output the analog image signals to the plurality of data lines D1, D2, . . . , Dm.

The scan driver 460 may provide the scan signal to the pixels through the scan lines S1, S2, . . . , Sn. For example, the timing controller 480 may generate a data control signal CTL1 that controls the data driver 440 and a scan control signal CTL2 that controls the scan driver 460. Here, the data control signal CTL1 may include the clock signal provided to the shift register of the data driver 330 and a line latch signal provided to the latch.

Figure 8:
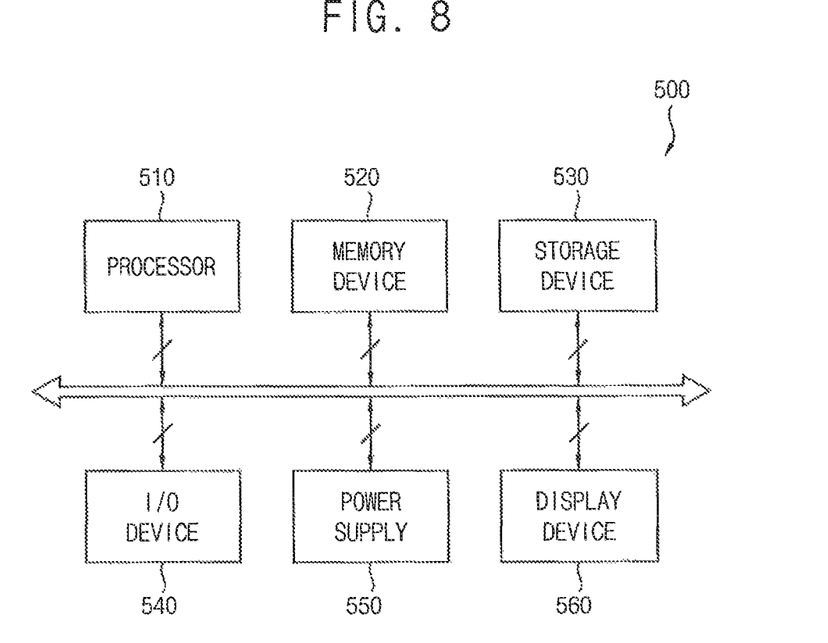
FIG. 8 is a block diagram illustrating an electronic device that includes the display device of FIG. 7.
Figure 9:
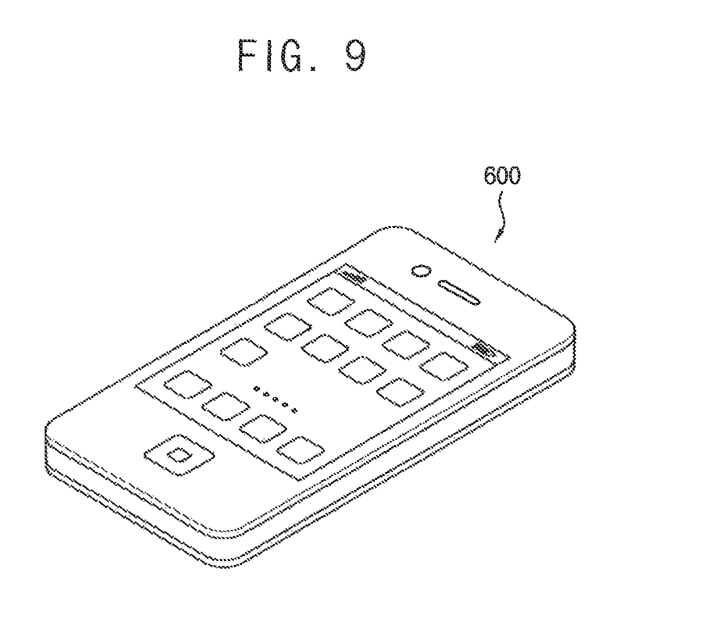
FIG. 9 is a diagram illustrating an embodiment of the inventive concept in which the electronic device of FIG. 8 is implemented as a smart phone.

FIG. 8 is a block diagram illustrating an electronic device that includes the display device of FIG. 7 and FIG. 9 is a diagram illustrating an embodiment of the inventive concept in which the electronic device of FIG. 8 is implemented as a smart phone.

Referring to FIGS. 8 and 9, an electronic device 500 may include a processor 510, a memory device 520, a storage device 530, an input/output (I/O) device 540, a power device 550, and a display device 560. Here, the display device 560 may correspond to the display device 400 of FIG. 7. In addition, the electronic device 500 may further include a plurality of ports for communicating a video card, a sound card, a memory card, a universal serial bus (USB) device, other electronic device, etc. Although it is illustrated in FIG. 9 that the electronic device 500 is implemented as a smart phone 600, a kind of the electronic device 500 is not limited thereto.

The processor 510, which may comprise hardware configured for operation, may perform various computing functions. The processor 510 may be a microprocessor, a central processing unit (CPU), etc. The processor 510 may be coupled to other components via an address bus, a control bus, a data bus, etc. Further, the processor 510 may be coupled to an extended bus such as surrounded component interconnect (PCI) bus. The memory device 520 (e.g. a non-transitory memory) may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc., just to name a few non-limiting possibilities. The storage device 530 may be a solid stage drive (SSD) device, a hard disk drive (HDD) device, a CD-ROM device, etc.

The I/O device 540 may be an input device such as a keyboard, a keypad, a touchpad, a touch-screen, a mouse, etc, and an output device such as a printer, a speaker, etc. In an embodiment of the inventive concept, the display device 560 may be included in the I/O device 540. The power device 550 may provide a power for operations of the electronic device 500. The display device 560 may communicate with other components via the buses or other communication links. As described above, the display device may include a display panel, a data driver, a scan driver, and a timing controller. The display panel may include a plurality of pixels. The data driver may provide a data signal to the pixels through data lines according to a scan signal. Here, the data driver may include a digital-to-analog converter that outputs an analog image signal to which an effect of a mismatch between capacitors is minimized using a multiplexer and a recursive switched circuit according to the inventive concept at least as discussed herein above. The scan driver may provide the scan signal to the pixels through the scan line. The timing controller may generate control signals that control the data driver and the scan driver.

Figure 10:
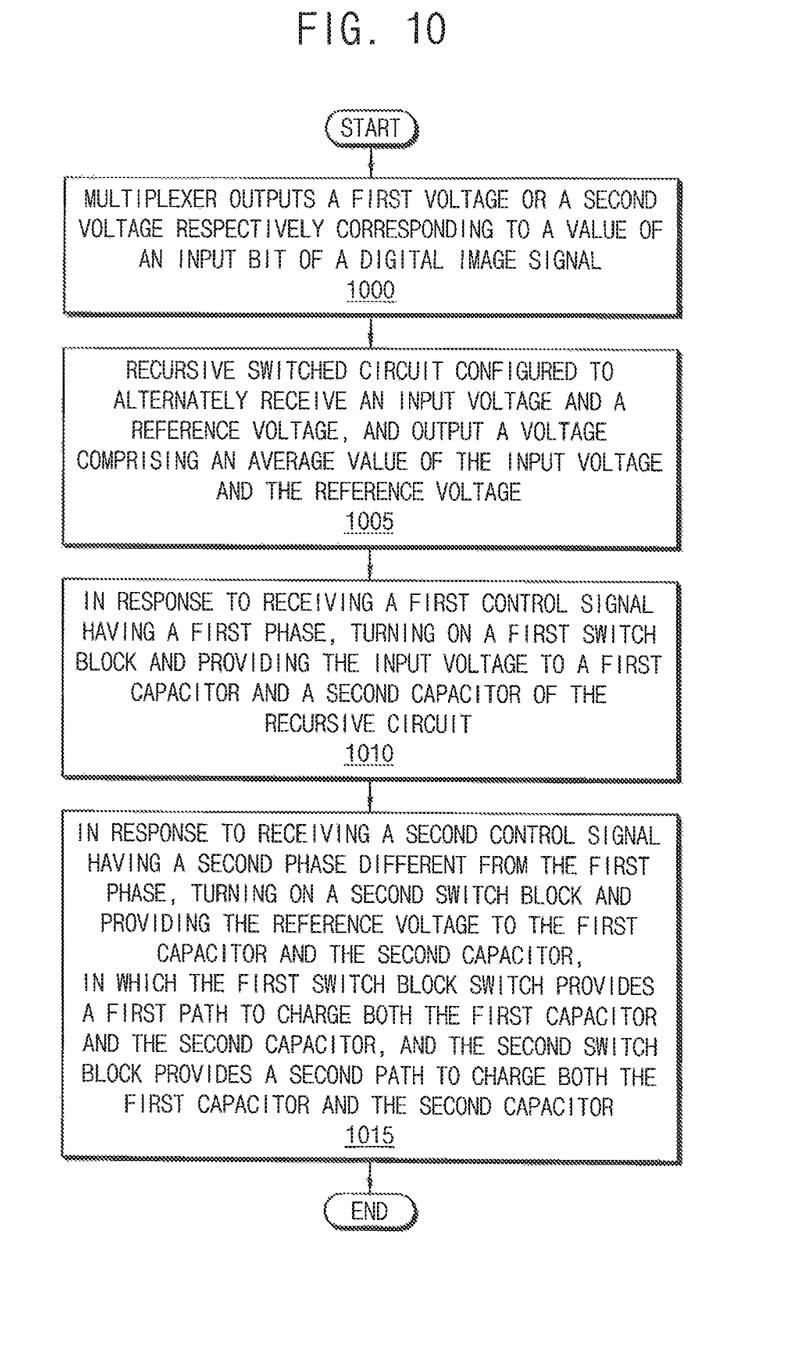
FIG. 10 is a flowchart providing an operational example of a method according to an embodiment of the inventive concept.

FIG. 10 is a flowchart providing an operational example of a method according to an embodiment of the inventive concept.

At operation 1000, a multiplexer outputs a first voltage or a second voltage respectively corresponding to a value of an input bit of a digital image signal. For example, V1 or V2 in FIG. 1.

At operation 1005, the recursive switched circuit configured to alternately receive an input voltage and a reference voltage, and output a voltage comprising an average value of the input voltage and the reference voltage.

At operation 1010, in response to receiving a first control signal having a first phase, turning on a first switch block and providing the input voltage to a first capacitor and a second capacitor of the recursive circuit.

At operation 1015, in response to receiving a second control signal having a second phase different from the first phase, turning on a second switch block and providing the reference voltage to the first capacitor and the second capacitor.

In the method as discussed above, the first switch block switch provides a first path to charge both the first capacitor and the second capacitor, and the second switch block provides a second path to charge both the first capacitor and the second capacitor.

The method then ends if there is a single digital-analog-converter. However, if the structure had multiple devices connected, such as in FIG. 4, the method would continue by having the digital-to-analog converter outputting an average value voltage that is input into another digital-to-analog converter.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of one or more embodiments of the inventive concept and is not to be construed as limiting thereof. Although a few embodiments of the inventive concept have been described, those skilled in the art will readily appreciate that many modifications are possible in the example embodiments without materially departing from the novel teachings and advantages of the present inventive concept. Accordingly, all such modifications are to be included within the scope of the present inventive concept as defined in the claims. Therefore, it is to be understood that the foregoing is illustrative of various embodiments of the inventive concept and is not to be construed as limited to any specific example disclosed herein, and that modifications to the disclosed embodiments of the inventive concept, as well as other example, are intended to be included within the scope of the appended claims.

What is claimed is:

1. A digital-to-analog converter comprising:
    a multiplexer configured to output a first voltage or a second voltage as an input voltage corresponding to an input bit; and
    a recursive switched circuit configured to alternately receive the input voltage and a reference voltage and to output an average value of the received input voltage and the reference voltage as an output voltage,
    wherein the recursive switched circuit corresponding to the input bit that is other than a most significant bit receives the output voltage of an other recursive switched circuit corresponding to an upper bit as the reference voltage.

2. The digital-to-analog converter of claim 1, wherein the input voltage and the reference voltage are received through different paths.

3. The digital-to-analog converter of claim 1, wherein the recursive switched circuit corresponding to the input bit that is other than the most significant bit includes:

a first capacitor and a second capacitor configured to divide the alternately received input voltage and the reference voltage across the first capacitor and the second capacitor;

a first switch block configured to couple the multiplexer that provides the input voltage to the first capacitor and the second capacitor; and a second switch block configured to couple a reference voltage provider that provides the reference voltage to the first capacitor and the second capacitor, and wherein the first switch block provides a first path to charge both the first capacitor and the second capacitor, and the second switch block provides a second path to charge both the first capacitor and the second capacitor.

4. The digital-to-analog converter of claim 3, further comprising: a controller configured to generate a control signal, wherein the first switch block and the second switch block are turned on or turned off according to a phase of a control signal.

5. The digital-to-analog converter of claim 4, wherein the control signal is a square wave having a constant cycle.

6. The digital-to-analog converter of claim 4, wherein the control signal includes a first control signal and a second control signal, and wherein the first switch block turns on when the first control signal having a first phase is provided, and wherein the second switch block turns on when the second control signal having a second phase is provided.

7. The digital-to-analog converter of claim 4, wherein when one of the first switch block and the second switch block is turned on, the other of the first switch block and the second switch block is turned off.

8. The digital-to-analog converter of claim 3, wherein the first capacitor and the second capacitor are coupled in series in a first phase and a second phase.

9. The digital-to-analog converter of claim 1, wherein the other recursive switched circuit corresponding to the upper bit receives a predetermined reference voltage, and the upper bit is the most significant bit.

10. A driving circuit of a display device comprising:
a digital-to-analog converter configured to convert a digital image signal into an analog image signal; and
an output buffer configured to output the analog image signal to a plurality of data lines,
wherein the digital-to-analog converter includes:
a multiplexer configured to output a first voltage and a second voltage as an input voltage corresponding to an input bit of the digital image signal; and
a recursive switched circuit configured to alternately receive the input voltage and a reference voltage and to output an average value of the input voltage and the reference voltage as an output voltage,
wherein the recursive switched circuit corresponding to the input bit being other than a most significant bit receives the output voltage of an other recursive switched circuit corresponding to an upper bit as the reference voltage.

11. The driving circuit of claim 10, wherein the recursive switched circuit corresponding to the input bit being other than the most significant bit includes: a first capacitor and a second capacitor configured to divide the alternately received input voltage and the reference voltage across the first capacitor and the second capacitor; a first switch block configured to couple the multiplexer that provides the input voltage to the first capacitor and the second capacitor; and a second switch block configured to couple a reference voltage provider that provides the reference voltage to the first capacitor and the second capacitor, wherein the first switch block provides a first path to charge both the first capacitor and the second capacitor, and the second switch block provides a second path to charge both the first capacitor and the second capacitor, and wherein the first switch block and the second switch block are turned on or turned off according to a phase of a control signal.

12. The driving circuit of claim 11, further comprising: a controller configured to generate a control signal, wherein the first switch block and the second switch block are turned on or turned off according to a phase of the control signal.

13. The driving circuit of claim 12, wherein the control signal is a square wave having a constant cycle.

14. The driving circuit of claim 12, wherein the first switch block turns on when the control signal having a first phase is provided, and wherein the second switch block turns on when the control signal having a second phase is provided.

15. The driving circuit of claim 14, wherein the first capacitor and the second capacitor are coupled in series in the first phase and the second phase.

16. The driving circuit of claim 10, wherein the other recursive switched circuit corresponding to the upper bit receives a predetermined reference voltage, and the upper bit is the most significant bit.

17. A method of digital-to-analog conversion, comprising:
outputting by a multiplexer a first voltage or a second voltage respectively as an input voltage corresponding to a value of an input bit of a digital image signal; and
outputting, by a recursive switched circuit configured to alternately receive the input voltage and a reference voltage, an output voltage comprising an average value of the input voltage and the reference voltage,
wherein the recursive switched circuit corresponding to the input bit that is other than a most significant bit receives the output voltage of an other recursive switched circuit corresponding to a more significant bit as the reference voltage.

18. The method of claim 17, wherein the recursive switched circuit corresponding to the input bit that is other than the most significant bit includes a first capacitor and a second capacitor configured to divide the alternately received input voltage and the reference voltage across the first capacitor and the second capacitor; in response to receiving a first control signal having a first phase, turning on a first switch block and providing the input voltage to the first capacitor and the second capacitor; and in response to receiving a second control signal having a second phase different from the first phase, turning on a second switch block and providing the reference voltage to the first capacitor and the second capacitor, wherein the first switch block provides a first path to charge both the first capacitor and the second capacitor, and the second switch block provides a second path to charge both the first capacitor and the second capacitor.

19. The method of claim 18, wherein the first switch block and the second switch block are turned on or turned off according to a phase of the first control signal and the second control signal, respectively.

20. The method of claim 17, wherein the other recursive switched circuit corresponding to the more significant bit receives a predetermined reference voltage, and the more significant bit is the most significant bit.

* * * * *